United States Patent [19]
Nishiwaki

[11] Patent Number: 6,051,914
[45] Date of Patent: Apr. 18, 2000

[54] PIEZOELECTRIC DEVICE, ACTUATOR USING THE SAME, AND INK-JET RECORDING HEAD

[75] Inventor: Tsutomu Nishiwaki, Nagano, Japan

[73] Assignee: Seiko Epson Corporation, Tokyo, Japan

[21] Appl. No.: 09/018,440

[22] Filed: Feb. 4, 1998

[30] Foreign Application Priority Data

Feb. 4, 1997 [JP] Japan ................................. 9-021855

[51] Int. Cl.[7] ................................................. H01L 41/04
[52] U.S. Cl. ............................................................ 310/358
[58] Field of Search ..................... 310/358; 252/62.9 DZ

[56] References Cited

U.S. PATENT DOCUMENTS

| | | | |
|---|---|---|---|
| 5,265,315 | 11/1993 | Hoisington et al. | 29/25.35 |
| 5,446,484 | 8/1995 | Hoisington et al. | 347/68 |
| 5,500,988 | 3/1996 | Moynihan et al. | 29/25.35 |
| 5,817,532 | 10/1998 | Joo et al. | 438/3 |

FOREIGN PATENT DOCUMENTS

| | | | |
|---|---|---|---|
| 0 736 915 | 10/1996 | European Pat. Off. | H01L 41/24 |
| WO 93/21637 | 10/1993 | WIPO | G11C 11/22 |

OTHER PUBLICATIONS

Jpn. J. Appl. Phys. vol. 34 (1995) pp. L1155–L1157 Part 2, No. 9A, Sep. 1, 1998 "Effect of Alkanolamines on the Microstructure and Dielectric Properties of Lead Zirconium Titanium Trioxide Thin Films Prepared from Modified Metal Alkoxides".

*Primary Examiner*—Nestor Ramirez
*Assistant Examiner*—Peter Medley
*Attorney, Agent, or Firm*—Sughrue, Mion, Zinn, Macpeak & Seas, PLLC

[57] ABSTRACT

A piezoelectric device comprises: a lower electrode; a piezoelectric film formed on the lower electrode; and an upper electrode formed on the piezoelectric film, wherein a low dielectric material having a dielectric constant that is lower than the piezoelectric film is formed at grain boundary exposed regions of the piezoelectric film.

10 Claims, 4 Drawing Sheets

PIEZOELECTRIC DEVICE, ACTUATOR USING THE SAME, AND INK-JET RECORDING HEAD

BACKGROUND OF THE INVENTION

The present invention relates to a piezoelectric device, an actuator employing the piezoelectric device, and an ink jet-recording head; and in particular to a piezoelectric device having an improved voltage withstandability, an actuator employing such a piezoelectric device and an ink-jet recording head.

Conventionally, a piezoelectric device, for which a piezoelectric film is sandwiched between a lower electrode and an upper electrode, is employed as a device for converting electric energy to mechanical energy. Such a piezoelectric device is used, for example, as an actuator for an ink-jet recording head. Specifically, an ink-jet recording head generally comprises: a head base in which are formed multiple separate ink channels, such as ink cavities and ink reservoirs; a vibration plate that is attached to the head base and that covers all the ink channels; and piezoelectric devices that are fixed to the portions of the vibration plate corresponding to the ink channels. The thus arranged ink-jet recording head applies an electric field to the piezoelectric devices and displaces them, and in this manner discharges ink, which is contained in the ink channels, from ink ejection ports formed on nozzle plates provided along the ink channels.

Each of the piezoelectric devices comprises a lower electrode, a piezoelectric film formed on the lower electrode, and an upper electrode formed on the piezoelectric film. The composition of the piezoelectric film is generally a binary system containing lead zirconate titanate (hereinafter referred to as PZT) as the primary element, or a ternary system for which a third element is added to the PZT of the binary system. Piezoelectric film having such a composition can be formed by the sputtering method, the sol-gel method, the laser ablation method or the CVD method.

However, for a conventional piezoelectric device no consideration is given to the enhancement of its voltage withstandability, and the insulation provided for the piezoelectric film may be destroyed by an electric field that is applied to the piezoelectric device. Further, no consideration is given to the relationship existing between the piezoelectric characteristic of the piezoelectric device (piezoelectric film) and the voltage withstandability. The criticality of these problems increases as the piezoelectric film becomes thinner.

SUMMARY OF THE INVENTION

To resolve the above problems it is one object of the present invention to provide a reliable piezoelectric device having improved voltage withstandability.

It is another object of the present invention to provide an actuator that can use this piezoelectric device and an ink-jet recording head that can employ such an actuator.

To achieve the above objects, according to the present invention, a piezoelectric device comprises: a lower electrode; a piezoelectric film formed on the lower electrode; and an upper electrode formed on the piezoelectric film, wherein a low dielectric material having a dielectric constant that is lower than the piezoelectric film is formed at grain boundary exposed regions of the piezoelectric film.

When an electric field is applied to the thus structured piezoelectric device, because of the low dielectric material that has been deposited, the voltage applied to the grain boundaries of the piezoelectric film can be lower than it can for a piezoelectric film on which the low dielectric material has not been deposited. In other words, the leakage of current flowing along the grain boundaries in the piezoelectric film can be reduced, and the voltage withstandability of the piezoelectric device can be improved.

The grain boundary of crystals of the piezoelectric film can exist substantially perpendicular to the faces of the electrodes.

The piezoelectric film can be formed using lead zirconate titanate as the primary element.

It is preferable that the thickness of the piezoelectric film be equal to or greater than 0.5 $\mu$m and equal to or less than 5 $\mu$m.

The low dielectric material can be produced using crystal that does not have a perovskite structure.

The dielectric material has a pyrochlore structure which satisfies: $A_2B_2O_7$, where A includes Pb, and B includes Zr and Ti. The low dielectric material can also be amorphous.

Furthermore, according to the present invention, provided is an actuator that incorporates, as a vibration device, a piezoelectric device having the above described structure.

In addition, according to the present invention, provided is an ink-jet recording head incorporating the actuator.

DETAILED DESCRIPTION OF THE PREFERRED EMBODIMENTS

The preferred embodiment of the present invention will now be described while referring to the accompanying drawings.

Figure 1:
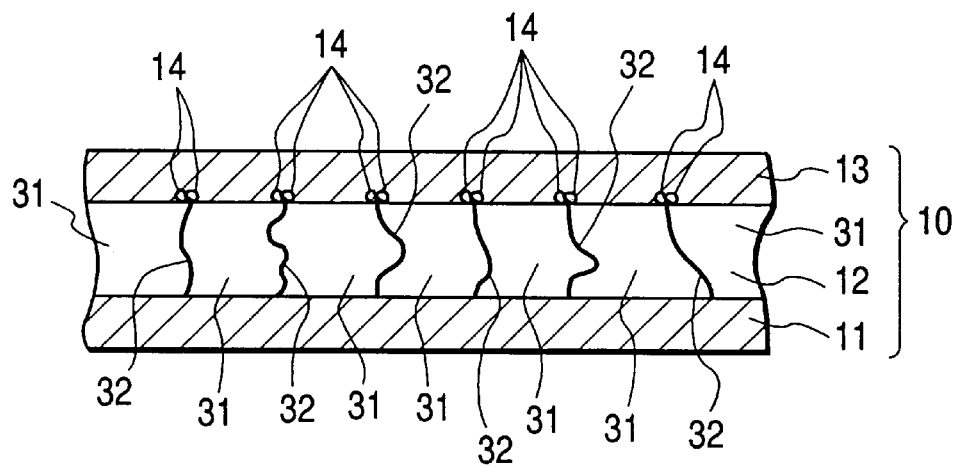
FIG. 1 is a cross-sectional view of a piezoelectric device according to one embodiment of the present invention.
Figure 2:
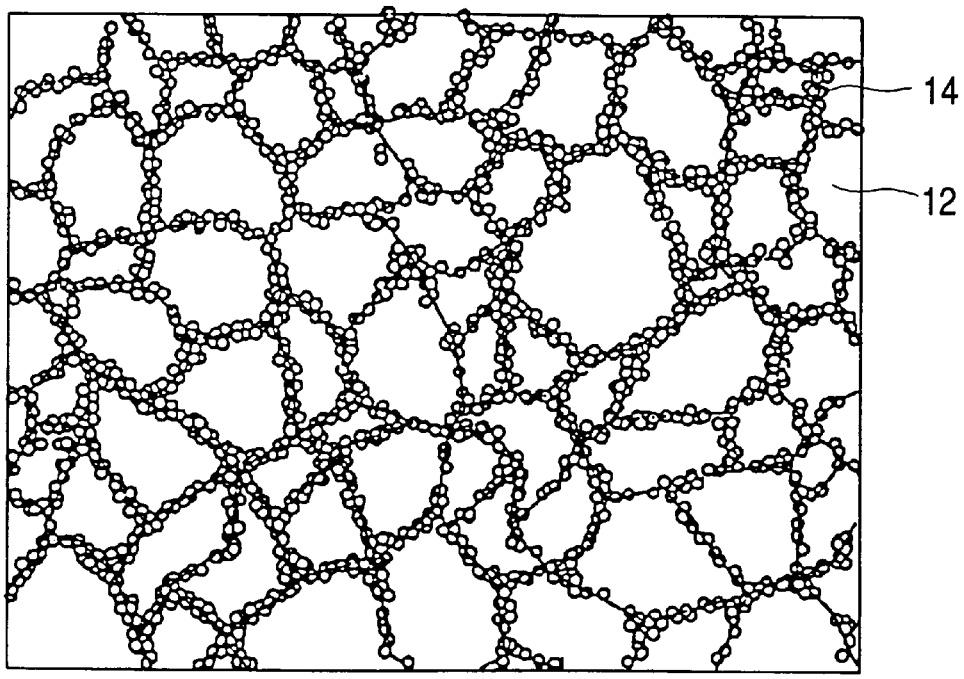
FIG. 2 is a specific diagram illustrating the surface of a piezoelectric film (PZT film) constituting the piezoelectric device in FIG. 1.
Figure 3:
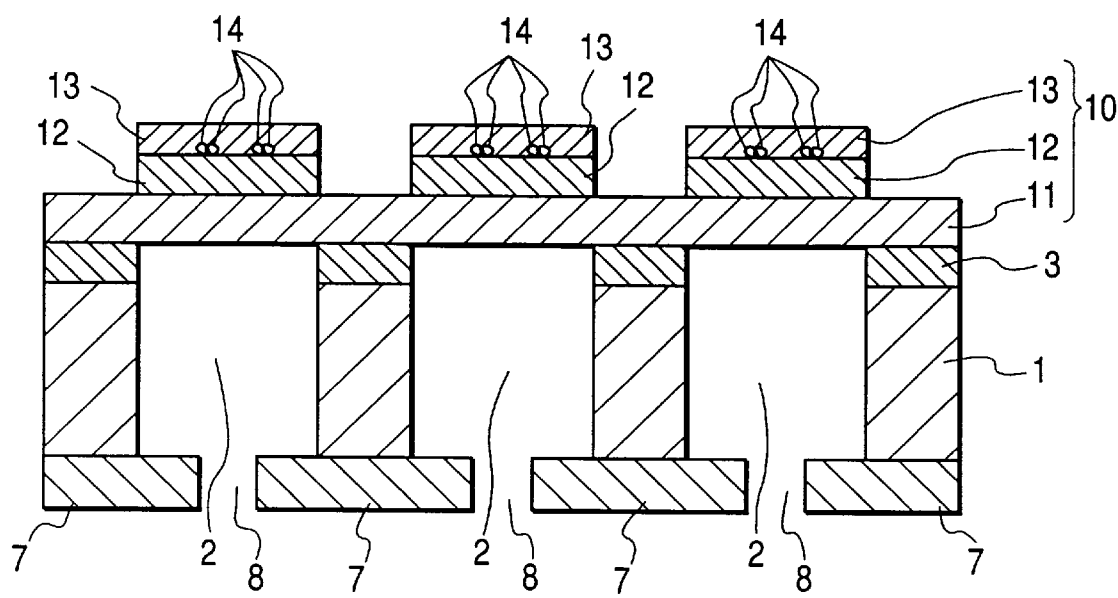
FIG. 3 is a cross-sectional view of one part of an ink-jet recording head having an actuator that employs, as a vibration plate, the piezoelectric device in the embodiment of the present invention.
Figure 4A:
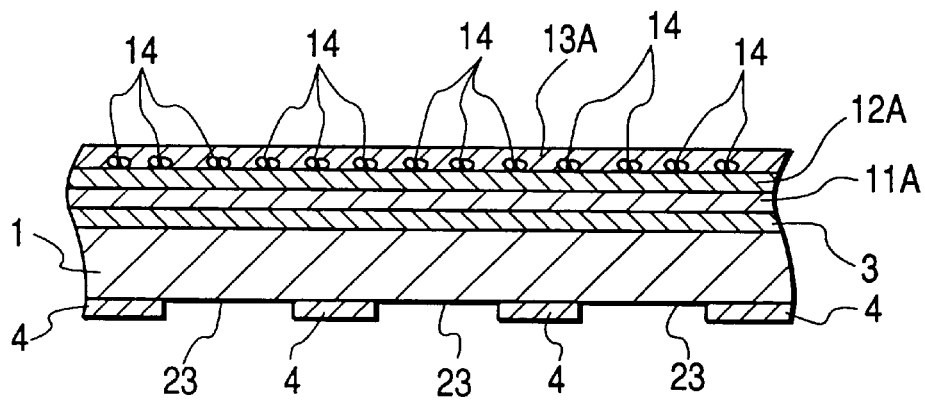
FIGS. 4A to 4C are cross-sectional views of the fabrication process for the ink-jet recording head in FIG. 3.
Figure 4B:
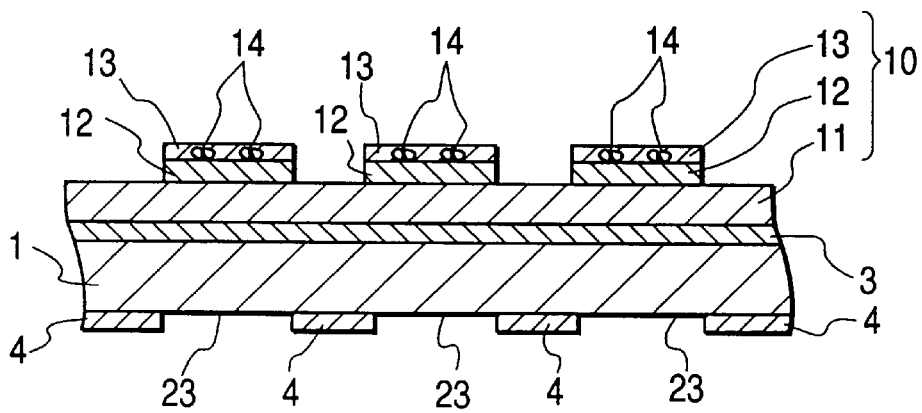
Figure 4C:
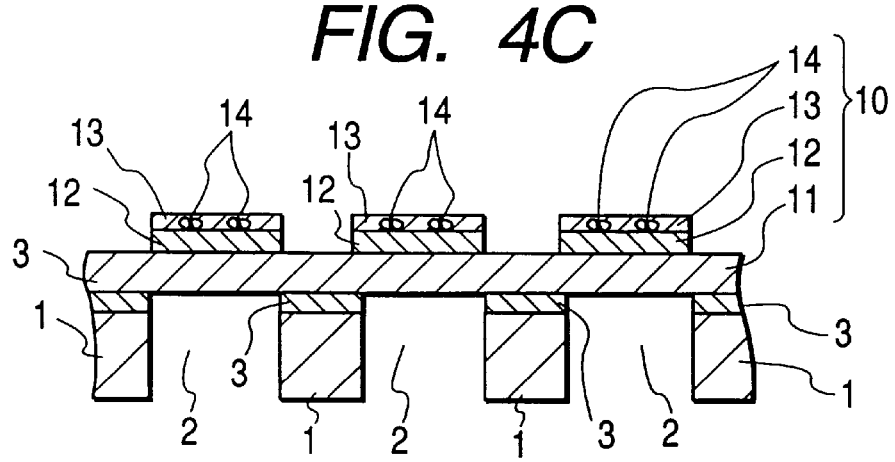

FIG. 1 is a cross-sectional view of a piezoelectric device according to one embodiment of the present invention; FIG. 2 is a specific diagram illustrating the surface of a piezoelectric film (PZT film) constituting the piezoelectric device in FIG. 1; FIG. 3 is a cross-sectional view of one part of an ink-jet recording head having an actuator that employs, as a vibration plate, the piezoelectric device in the embodiment of the present invention; and FIGS. 4A to 4C are cross-sectional views of the fabrication process for the ink-jet recording head in FIG. 3.

As is shown in FIGS. 1 and 2, a piezoelectric device 10 according to the present invention comprises: a lower electrode 11; a piezoelectric film 12 formed on the lower electrode 11; a low dielectric material 14, which is formed in the grain boundary exposed region of the piezoelectric film 12 and its vicinity, and which has a dielectric constant lower than the piezoelectric film 12; and an upper electrode 13 formed on the piezoelectric film 12, on which the dielectric material 14 is formed.

Although the method for forming the piezoelectric film 12 will be described later in detail, shown below is the chemical formula for the composition of the piezoelectric film 12.

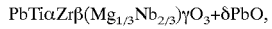

where
α=0.4,
β=0.5 and
γ=0.1.

As is shown in FIG. 1, the piezoelectric film 12 is made of columnar crystal grains 31, with grain boundaries 32 of the crystal grains 31 being substantially perpendicular to the surface of the film 12.

When the dielectric constants of the piezoelectric film 12 and the low dielectric material 14 were measured, readings of 1200 to 2800 were obtained for the relative dielectric constant of the piezoelectric film 12, and readings of 3 to 80 were obtained for the relative dielectric constant of the low dielectric material 14.

An ink-jet recording head according to this embodiment comprises, as is shown in FIG. 3, a single crystal silicon substrate 1 in which a plurality of ink chambers 2 are formed; a piezoelectric device 10 formed on the single crystal silicon substrate 1 via dioxide silicon film 3 to seal the sides of the ink chambers 2; and a nozzle plate 7, which seals the opposite sides of the ink chambers 2 and in which are formed ink ejection nozzles 8. And provided for the ink-jet recording head is an actuator that employs the piezoelectric device 10 as a vibration plate.

In this embodiment, the length of the ink chambers 2 in the direction in which they are arranged is set at 100 μm, and the length in the direction of their depths is set at 4 mm. The pitch of the ink chambers 2 is 141 μm, and its resolution is 180 dpi (dots per inch). The longitudinal length of the piezoelectric film 12 is set at 80 μm.

The method for fabricating the ink-jet recording head will now be described while referring to the fabrication process in FIGS. 4A to 4C.

In the process in FIG. 4A, wet thermal oxidization is performed at 1200° C. for the single crystal silicon substrate 1 (having a thickness of 220 μm) having a bearing face (110), simultaneously forming a dioxide silicon film 3 on the top face of the single crystal silicon substrate 1, and a dioxide silicon film 4 on the bottom face of the substrate 1.

Then, a platinum lower electrode forming film 11A, a piezoelectric forming film 12A and an upper electrode forming film 13A are deposited in order on the dioxide silicon film 3. Actually, between the dioxide silicon film 3 and the platinum lower electrode forming film 11A, a titanate film (having a thickness of 250 Å), a dioxide titanate film (having a thickness of 200 Å) and a titanate film (having a thickness of 50 Å) are formed in order as intermediate films to enhance the adhesion of the two films 3 and 11A. The four layers of the intermediate films and the platinum lower electrode forming film 11A are sequentially formed by direct current sputtering, and the dioxide titanate film is deposited by reactive sputtering in an atmosphere of 10% oxygen.

For the deposition of the piezoelectric film forming film 12A, first, organic material is adjusted that is represented by the following chemical formula:

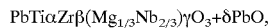

where
α=0.4,
β=0.5 and
γ=0.1.

Then, the organic material is coated (spin-coated) on the platinum lower electrode forming film 11A using a spin coating machine. The resultant structure is dried at 180° C. for 10 minutes, and is then degreased in an atmosphere held at 400° C. for 30 minutes. The coating, drying and degreasing procedures for the organic material are repeated six times. Thereafter, RTA (Rapid Thermal Annealing) is used to sequentially anneal the resultant structure at 650° C. for three minutes and at 900° C. for one minute. As a result, the piezoelectric film forming film 12A made of PZT of about 1 μm thick is obtained.

The grain boundaries of the crystals of the piezoelectric film forming film 12A exist perpendicular to the surface of the lower electrode 11. In addition, the low dielectric material 14, which has a dielectric constant lower than the piezoelectric film forming film 12A, is formed in the grain boundary exposed regions of the piezoelectric film forming film 12A and their vicinities.

Then, the upper electrode forming film 13A, composed of platinum and having a thickness of 200 nm, is formed on the piezoelectric film forming film 12A by direct current sputtering.

Following this, a photoresist film (not shown) is deposited on the dioxide silicon film 4, and the portions corresponding to the regions where the ink chambers 2 made of the photoresist film are to be formed are selectively removed, thus forming an etching mask (not shown). Then, to form openings 23, the etching mask is employed to pattern the dioxide silicon film 4 using an aqueous solution of hydrogen fluoride and ammonium fluoride.

Following this, in the procedure shown in FIG. 4B, an etching mask (not shown) is formed on the portions corresponding to the regions on the upper electrode forming film 13A at which the upper electrodes are to be formed. The etching mask is employed to etch the upper electrode forming film 13A and the piezoelectric film forming film 12A using ion milling, thereby forming the upper electrodes 13 and the piezoelectric films 12. Then, the platinum lower electrode forming film 11A is patterned to obtain the lower electrode 11. As a result, the piezoelectric device 10 constituted by the lower electrode, the piezoelectric films 12, the low dielectric films 14 and the upper electrodes 13 is obtained.

In the procedure shown in FIG. 4C, the side of the single crystal silicon substrate 1 on which the piezoelectric device 10 is formed is protected by a jig (not shown). Then, the single silicon substrate 1 is immersed in a potassium hydroxide aqueous solution at 80° C., and the dioxide silicon film 4 in which the openings 23 are formed is employed as a mask to perform anisotropic etching of the single crystal silicon substrate 1 until the dioxide silicon film 3 is exposed.

When the potassium hydroxide aqueous solution is used as an etching solution for anisotropic etching, the ratio of the etching speed on the face (110) and the face (111) of the single crystal silicon substrate 1 is about 300:1. Since a 220 μm deep groove in the single crystal silicon substrate 1 can be restricted to a width of 1 μm for side etching, the ink chambers 2 can be accurately formed.

While the jig is secured to the single crystal silicon substrate 1, the dioxide silicon film 4 and the exposed dioxide silicon film 3 are removed by etching using an aqueous solution of hydrogen fluoride and ammonium fluoride, and the ink chambers 2 are formed. Thereafter, a predetermined process is performed to complete the ink-jet recording head.

According to an analysis performed using a transmission electron microscope or an electron diffractograph, the element construction for the low dielectric films 14 is the same as that for the piezoelectric films 12, but the crystal structure for the piezoelectric films 12 is a perovskite structure, while the crystal structure for the low dielectric films 14 is an amorphous structure or a pyrochlore structure.

The process whereby the low dielectric films 14 are formed is considered to be as follows. As the piezoelectric crystal grains 31 in FIG. 1 grow, the extra composition material that is generated by annealing the piezoelectric film 12 during the crystal growing process for the low dielectric films 14 is dispersed toward the grain boundaries 32. Finally, when the adjacent grains 31 are joined and the grain boundaries 32 are closed, the low dielectric films 14 are pushed through the grain boundaries 32 to the surface of the layer.

The number of the low-dielectric films 14 to be generated varies depending on the original composition of the piezoelectric film and the annealing condition; however, since the number of films to be generated is changed linearly depending on the composition and the annealing condition, the number of films can be arbitrarily controlled.

Figure 5:
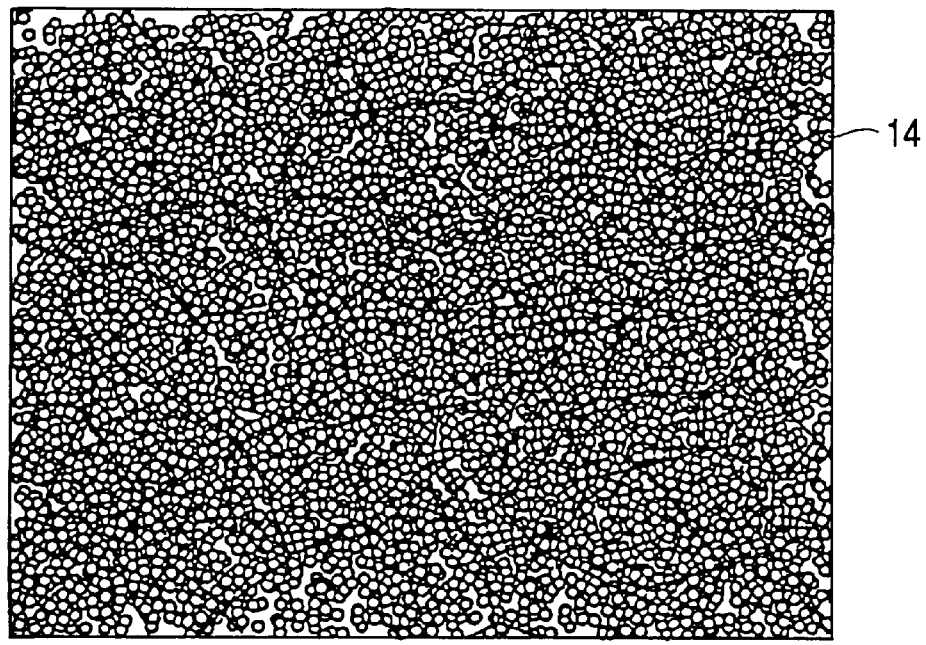
FIG. 5 is a specific diagram illustrating the surface of a piezoelectric film (PZT film) constituting the piezoelectric film according to another embodiment of the present invention.

In this embodiment, the low dielectric films 14 are formed in the grain boundary exposed regions of the piezoelectric film 12 and their vicinities, as is shown in FIG. 2. The formation of the film 14 is not thereby limited, however, and as is shown in FIG. 5, the film 14 may be deposited across almost all the surface of the piezoelectric film 12, or may be formed only at the grain boundary exposed regions.

According to the chemical formula representing the piezoelectric film 12 in this embodiment, ink-jet recording heads were produced in which the piezoelectric film was so deposited that the molar ratio (δ) of extra Pb had the values shown in Table 1 (samples 1 to 5).

The surface form, the piezoelectric characteristic and insulation-destruction voltage for the piezoelectric film were examined for each of the samples. The results are shown in Table 1.

For the surface form of the piezoelectric film, the results obtained by observation using a TEM (transmission electron microscope) are typically represented.

TABLE 1

Figure 6:
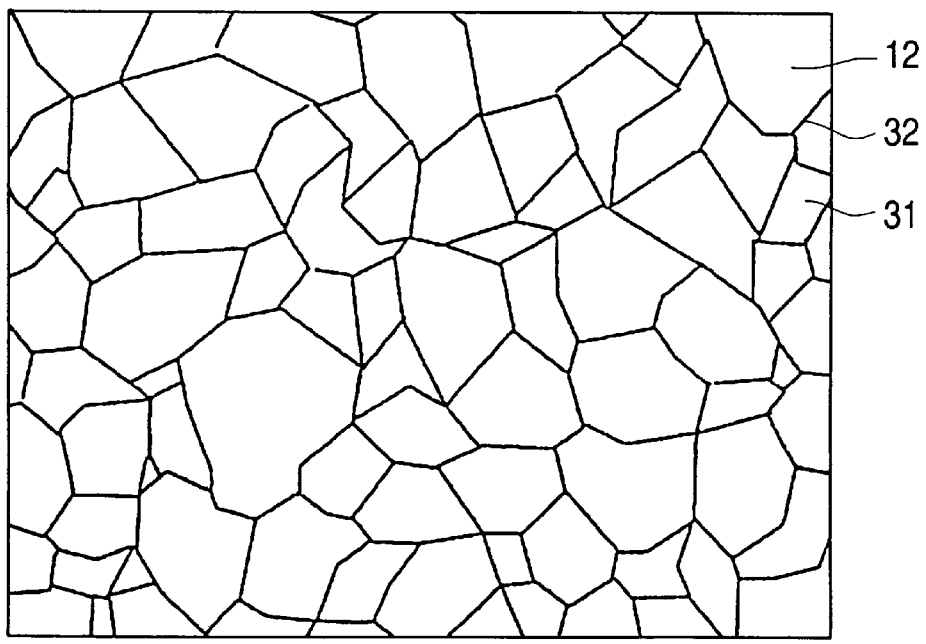
FIG. 6 is a specific diagram illustrating the surface of a piezoelectric film (PZT film) constituting a conventional piezoelectric film.

| Sample No. | Pb Ratio (δ) | Piezoelectric Characteristic d31 (pG/N) | Insulation-Destruction Voltage V | Surface Condition | Remarks |
| --- | --- | --- | --- | --- | --- |
| No. 1 | 0 | 76 | 61 | FIG. 5 | Present invention |
| No. 2 | 0.05 | 107 | 50 | | Present invention |
| No. 3 | 0.10 | 118 | 51 | FIG. 2 | Present invention |
| No. 4 | 0.15 | 120 | 30 | | Compared example |
| No. 5 | 0.20 | 83 | 23 | FIG. 6 | Compared example |

As is apparent from Table 1, compared with the comparison examples (samples 4 and 5), the ink-jet recording heads (samples 1 to 3) according to the present invention had a high insulation-destruction voltage and improved voltage withstandability. This is because when an electric field is applied to the piezoelectric devices of the ink-jet recording heads according to the present invention, as a consequence of the presence of the low dielectric material the voltage applied to the grain boundaries of the piezoelectric films is low and insulation-destruction seldom occurs, even upon the application of a high voltage.

In this embodiment, the crystal structure of the low-dielectric material is amorphous. However, the structure is not limited to this, and may be pyrochlore.

In addition, in this embodiment the piezoelectric film has been made of PZT, which is represented by the previously mentioned chemical formula. However, the piezoelectric film is not limited to this material, but may be made of PZT having a composition represented by a different chemical formula, or by any other material so long as that material can be used to construct the piezoelectric device.

Further, the fabrication method of the present-invention is merely an example, and may be arbitrarily modified so long as a low dielectric film, having a dielectric constant lower than piezoelectric film, is formed at least at the grain boundary exposed regions of the piezoelectric film.

As is described above, according to the present invention, since the low dielectric material is formed at the grain boundary exposed regions of the piezoelectric film, when an electric field is applied to the piezoelectric device, the voltage applied to the grain boundaries of the piezoelectric film can be lower than it is in a case when the low dielectric material is not formed. That is, since the amount of leakage of the current flowing along the grain boundaries of the piezoelectric film can be reduced, the destruction of the insulation available for the piezoelectric film can be prevented. As a result, the voltage withstandability of the piezoelectric device can be improved, and a reliable piezoelectric device can be provided.

In addition, a reliable actuator and an ink-jet recording head for which the piezoelectric device is employed can be provided.

What is claimed is:

1. A piezoelectric device comprising:
    a lower electrode;
    a piezoelectric film formed on said lower electrode; and
    an upper electrode formed on said piezoelectric film,
        wherein a low dielectric material having a dielectric constant that is lower than said piezoelectric film is formed at all boundary exposed regions of said piezoelectric film on a side of said piezoelectric film.

2. The piezoelectric device according to claim 1, wherein said grain boundary of crystals of the piezoelectric film exist substantially perpendicular to the faces of said electrodes.

3. The piezoelectric device according to claim 1, wherein said piezoelectric film comprises a lead zirconate titanate.

4. The piezoelectric device according to claim 1, wherein the thickness of said piezoelectric film is equal to or greater than 0.5 µm and equal to or less than 5 µm.

5. The piezoelectric device according to claim 1, wherein said low dielectric material is produced using crystal that does not have a perovskite structure.

6. The piezoelectric device according to claim 1, wherein said dielectric material has a pyrochlore structure which satisfies:

$A_2B_2O_7$, where A includes Pb, and B includes Zr and Ti.

7. The piezoelectric device according to claim 1, wherein said low dielectric material is amorphous.

8. The piezoelectric device according to claim 1, wherein said low dielectric material is formed on a whole surface of said piezoelectric film.

9. An actuator incorporating, as a vibration device, said piezoelectric device according to one of claims 1 to 8.

10. An ink-jet recording head incorporating said actuator according to claim 9.

* * * * *